United States Patent [19]
Chang

[11] Patent Number: 6,160,456
[45] Date of Patent: Dec. 12, 2000

[54] PHASE-LOCKED LOOP HAVING ADJUSTABLE DELAY ELEMENTS

[75] Inventor: Horng-Der Chang, Hsinchu, Taiwan

[73] Assignee: REALTEK Semiconductor Corp., Hsinchu, Taiwan

[21] Appl. No.: 09/332,149

[22] Filed: Jun. 14, 1999

[51] Int. Cl.$^7$ ........................................................ H03L 7/18

[52] U.S. Cl. ............................ 331/25; 331/1 A; 327/158; 327/159; 327/161

[58] Field of Search .................................... 327/158, 160, 327/159, 161, 152; 331/25, 1 A

[56] References Cited

U.S. PATENT DOCUMENTS

5,079,520  1/1992  Rapeli ........................................ 331/1 A

*Primary Examiner*—Arnold Kinkead
*Attorney, Agent, or Firm*—Bacon & Thomas, PLLC

[57] ABSTRACT

A phase-locked loop which achieves the effect of frequency expansion is disclosed. An adjustable delay element is incorporated in a conventional phase-locked loop in order that one of the output clock signals of a divided-by-N counter and a divided-by-M counter leads (lags behind) the other. This in turn causes a phase frequency detector to alternately generate 'up' and 'dn' signals, thereby frequency expansion is achieved.

19 Claims, 8 Drawing Sheets

PHASE-LOCKED LOOP HAVING ADJUSTABLE DELAY ELEMENTS

FIELD OF THE INVENTION

The present invention relates generally to a phase-locked loop, and more particularly, to a phase-locked loop that utilizes adjustable delay elements to achieve frequency expansion.

BACKGROUND OF THE INVENTION

In the clock signal synthesizer of a mainboard, a phase-locked loop is often utilized to correctly recover data. Moreover, a modification is often made to a phase-locked loop so that frequency expansion can be achieved for the purpose of reducing electromagnetic is interference (EMI) significantly. However, there is no simple solution in the prior art that provides a phase-locked loop with frequency expansion capability.

Figure 1:
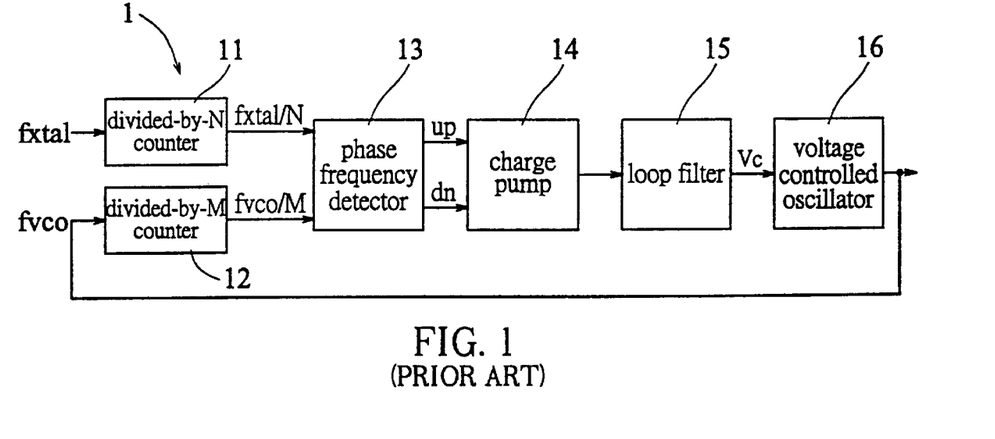
FIG. 1 is the block diagram of a prior art phase-locked loop.

FIG. 1 illustrates a conventional phase-locked loop comprising a divided-by-N counter 11, a divided-by-M counter 12, a phase frequency detector 13, a charge pump 14, a loop filter 15, and a voltage controlled oscillator 16.

Figure 2:
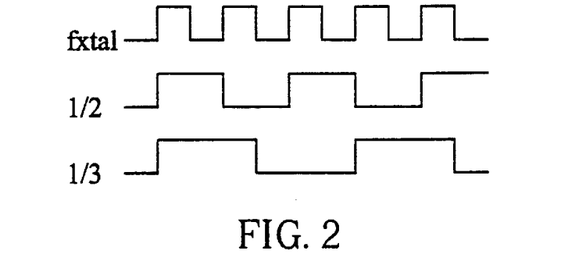
FIG. 2 illustrates the output of a divided-by-N counter which receives a clock signal $f_{xtal}$.
Figure 3A:
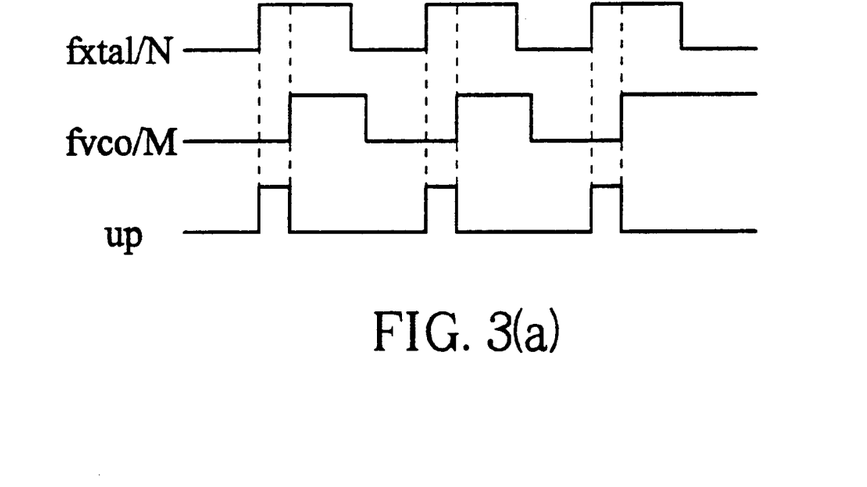
FIG. 3(a) illustrates the output of a phase frequency detector when the phase of a signal $f_{vco}/M$ lags behind that of a signal $f_{xtal}/N$.
Figure 3B:
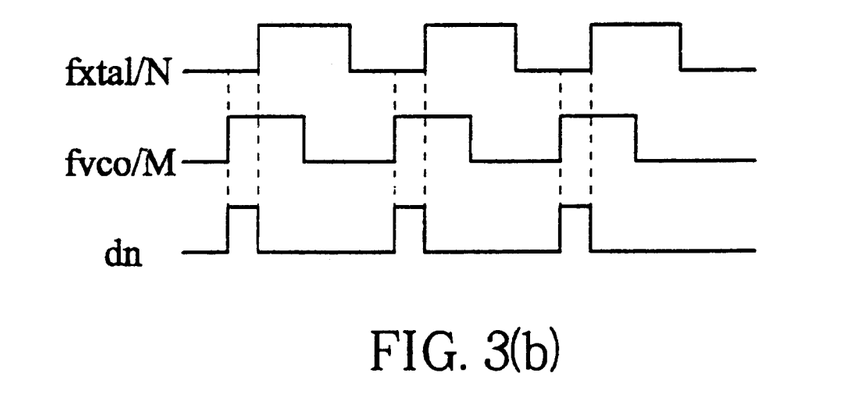
FIG. 3(b) illustrates the output of a phase frequency detector when the phase of a signal $f_{vco}/M$ leads that of a signal $f_{xtal}/N$.
Figure 4:
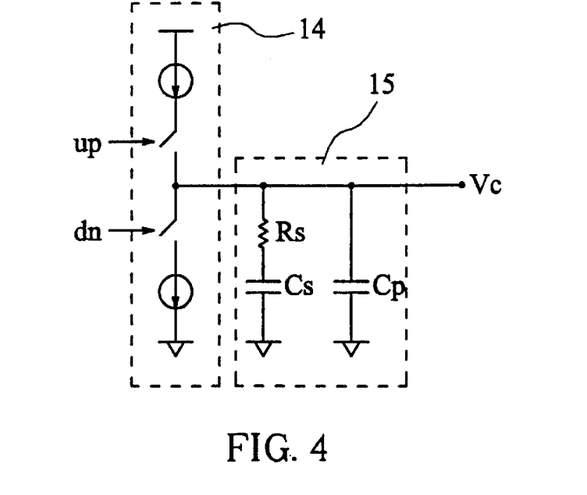
FIG. 4 depicts the circuit of a charge pump and a loop filter.

The divided-by-N counter 11 outputs a clock signal (it will be denoted by $f_{xtal}/N$ in the following) with frequency $1/N$ that of the input clock signal $f_{xtal}$. FIG. 2 illustrates the situations that the frequency of an input clock signal is divided by 2 and 3 respectively. The divided-by-M counter 12 outputs a clock signal (it will be denoted by $f_{vco}/M$ in the following) with frequency $1/M$ that of the input clock signal $f_{vco}$. The phase frequency detector 13 outputs voltage signals (up dn) which are determined by the frequency difference and phase difference of the two input signals $f_{xtal}/N$ and $f_{vco}/M$. As shown in FIG. 3(a), when the phase of $f_{vco}/M$ lags behind that of $f_{xtal}/N$ (as denoted in the figure by dotted lines), the phase frequency detector 13 outputs an 'up' signal. On the other hand, as shown in FIG. 3(b), when the phase of $f_{vco}/M$ leads that of $f_{xtal}/N$ (as denoted in the figure by dotted lines), the phase frequency detector 13 outputs a 'dn' signal. Referring to FIG. 4, the charge pump 14 and the loop filter 15 cooperatively convert the 'up' and 'dn' signals outputted from the phase frequency detector 13 into a voltage signal Vc. When the phase frequency detector 13 outputs an 'up' signal, the upper switch in the charge pump 14 is ON and current flows into the loop filter 15. The output voltage Vc of the loop filter 15 is raised. On the other hand, when the phase frequency detector 13 outputs an 'dn' signal, the lower switch in the charge pump 14 is ON and current flows from the loop filter 15 to the lower current source. The output voltage Vc of the loop filter 15 is lowered. The voltage controlled oscillator 16 outputs a clock signal with frequency $f_{vco}$ determined by the output voltage $V_c$ from the loop filter 15. The frequency $f_{vco}$ increases as $V_c$ increases, and $f_{vco}$ decreases as $V_c$ decreases.

Figure 5:
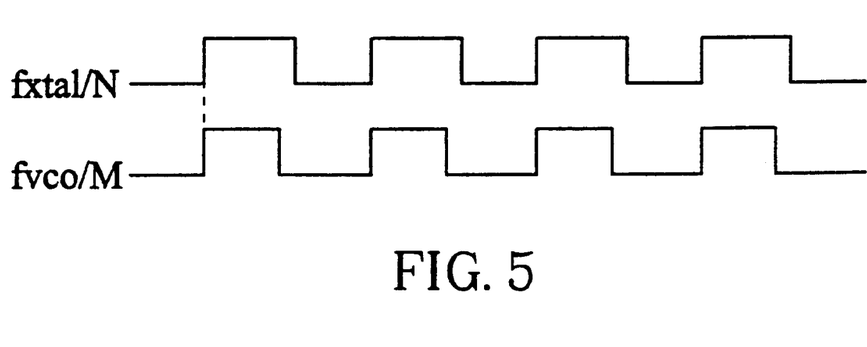
FIG. 5 depicts the signals $f_{xtal}/N$ and $f_{vco}/M$ in the phase-locked loop in accordance with the present invention when it is in a phase-locked state.

As described above, when the phase-locked loop 1 is in a phase-locked state, the phase of $f_{xtal}/N$ is in alignment with that of $f_{vco}/M$ and and the frequencies of these two clock signals are the same, as shown in FIG. 5. In other words, $f_{vco}=(M/N)\times f_{xtal}$. It can be seen from this relation that the $f_{vco}$ can be determined by M and N.

Figure 6:
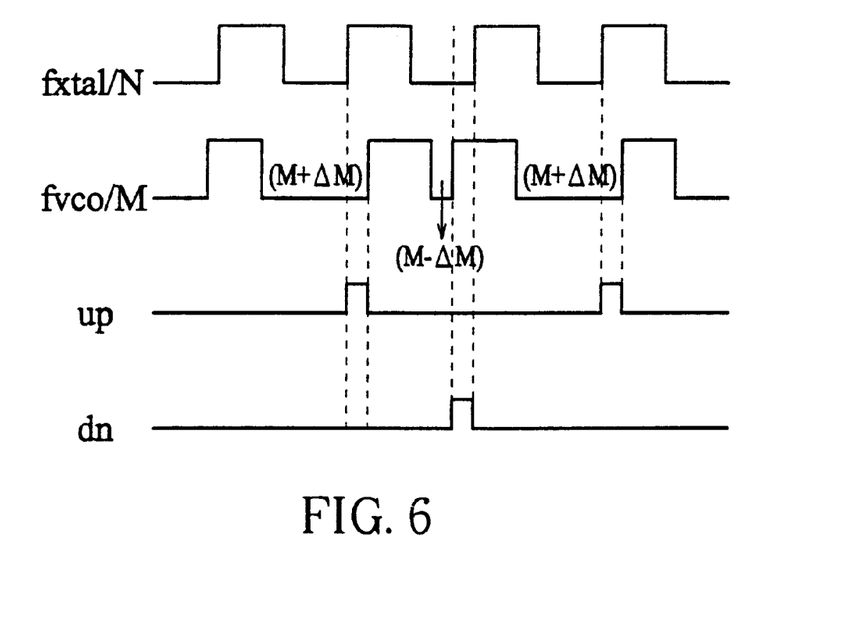
FIG. 6 illustrates the alternate generation of 'up' and 'dn' signals when M is changed to (M+ΔM) or (M−ΔM).

The concept of frequency expansion is described in the following. Assume that a clock signal with certain fixed frequency is desired, then clock signals with frequency varies in a predetermined frequency range centering at that frequency is generated. For example, frequency may vary linearly and periodically in a predetermined frequency range. Referring to FIG. 1, the frequency $f_{vco}$ can be made to vary linearly and periodically by making Vc vary linearly and periodically, which can be derived if the 'up' and 'dn' signals vary alternately and periodically. Moreover, the 'up' and 'dn' signals may be made to vary alternately and periodically by adjusting the values of M and/or N. As shown in FIG. 5, while the phase-locked loop 1 is in a phase-locked state, the phase of $f_{xtal}/N$ is in alignment with that of $f_{vco}/M$ and there is no 'up' or 'dn' signal generated. Referring to FIG. 6, when the value of M is suddenly changed to (M+ΔM) or (M−ΔM), the 'up' and 'dn' signals are alternately generated. Similarly, when the value of N is suddenly changed to (N+ΔN) or (N−ΔN), the 'up' and 'dn' signals are alternately generated as well.

Figure 7:
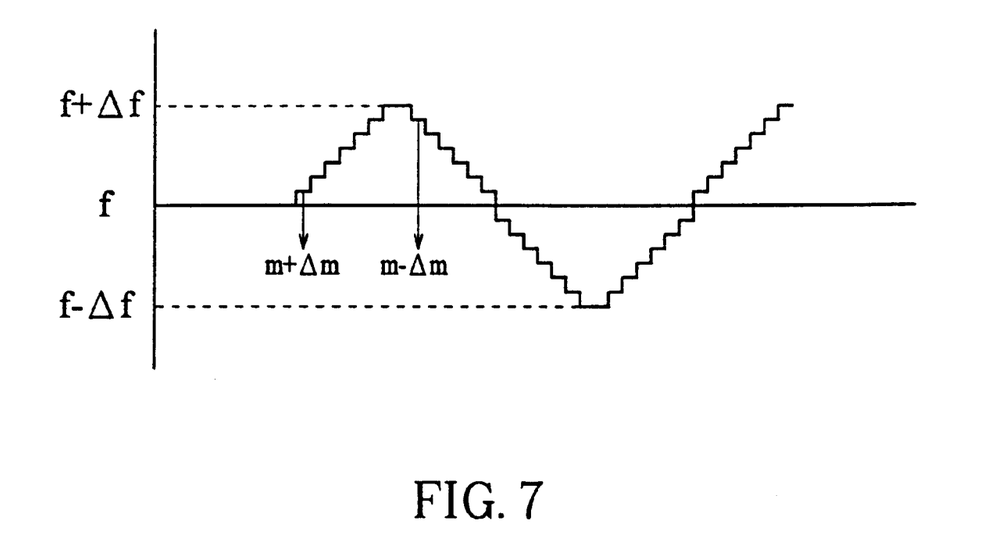
FIG. 7 illustrates the variation of $f_{vco}$ when the value of M varies periodically.

As described above, changing the value of M (or N) results in the 'up' and 'dn' signals being generated alternately. This in turn makes Vc vary linearly and periodically. Consequently, the value of $f_{vco}$ varies linearly and periodically. FIG. 7 shows the variation of $f_{vco}$ when M varies through a series of increments (ΔM) and then a series of decrements (−ΔM). From the figure, it can be seen that $f_{vco}$ varies linearly and periodically in a predetermined frequency range centering at the frequency f.

From the above description, it can be seen that a phase-locked loop can achieve the effect of frequency expansion by changing the values of M and N. However, changing the values of M and N is not easy and may require a quite complicated circuit.

SUMMARY OF THE INVENTION

It is therefore an object of the present invention to provide a simple phase-locked loop having frequency expansion capability.

The present invention is primarily characterized in that an adjustable delay element is inserted between the divided-by-N counter and the phase frequency detector, or between the divided-by-M counter and the phase frequency detector. Accordingly, one of the output signals of the divided-by-N counter and the divided-by-M counter has phase leads (or lags behind) the phase of the other. This causes a phase frequency detector to alternately generate 'up' and 'dn' signals so that effect of frequency expansion can be achieved.

To achieve the aforementioned object, the phase-locked loop in accordance with the present invention comprises: a divided-by-N counter, a divided-by-M counter, a first adjustable delay element, a second adjustable delay element, a phase frequency detector, a charge pump, a loop filter, and a voltage controlled oscillator. The divided-by-N counter outputs a clock signal with frequency 1/N that of its input signal. The divided-by-M counter outputs a clock signal with frequency 1/M that of its input signal. The first adjustable delay element consists of a first delay array circuit, a first selection switching unit, and a first clock counter. The first delay array circuit receives the output signal of the divided-by-M counter. The first selection switching unit selects the output path of the first delay array circuit. The clock counter provides a clock signal for controlling the switching time of the first selection switching unit. The second adjustable delay element consists of a second delay array circuit, a second selection switching unit, and a second clock counter. The second delay array circuit receives the output signal of the divided-by-N counter. The second selection switching unit selects the output path of the second delay array circuit. The clock counter provides a clock signal for controlling the switching time of the second selection switching unit. The phase frequency detector receives the output signal of the second selection switching unit and the output signal of the divided-by-N counter, outputs control signals that are determined by the phase difference and frequency difference between the two received signals. The charge pump receives the control signals outputted from the phase frequency detector. The loop filter is coupled to and cooperates with the charge pump to output a voltage signal. The voltage controlled oscillator receives the voltage signal and outputs a clock signal which is used as the input signal of the divided-by-M counter.

Although the phase-locked loop described in the preceding paragraph has two delay elements, the phase-locked loop having merely one delay element can achieve the effect of frequency expansion as well, which is described as follows.

BRIEF DESCRIPTION OF THE DRAWINGS

The above and other objects, features and effects of the present invention can be best understood by referring to the following detailed description of the preferred embodiment and the accompanying drawings, wherein.

DETAILED DESCRIPTION OF THE PREFERRED EMBODIMENTS

Figure 8:
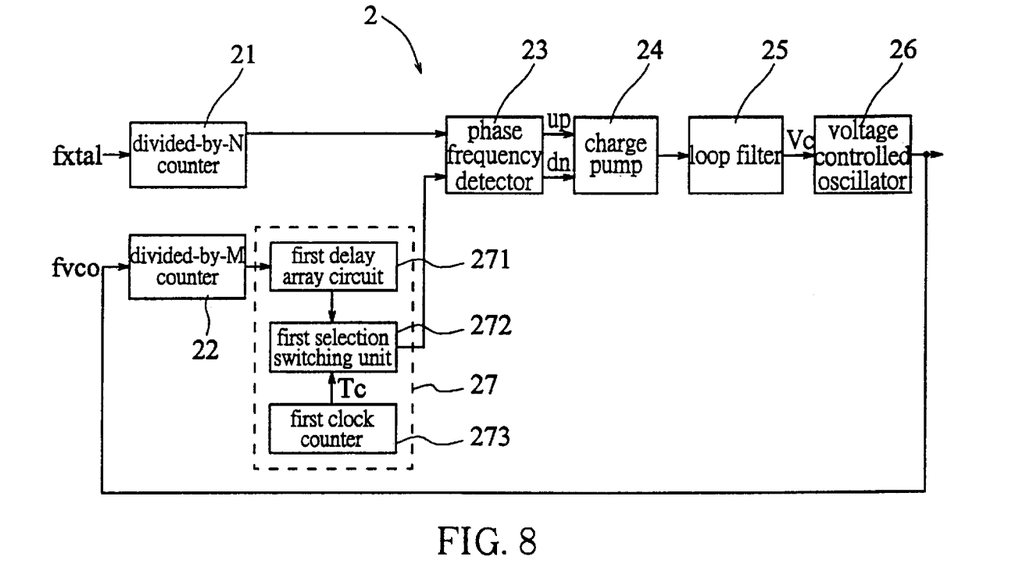
FIG. 8 is the block diagram of the first preferred embodiment of the phase-locked loop in accordance with the present invention.

Referring first to FIG. 8, the phase-locked loop having an adjustable delay element includes: a divided-by-N counter 21, a divided-by-M counter 22, a phase frequency detector 23, a charge pump 24, a loop filter 25, a voltage controlled oscillator 26, and a first adjustable delay element 27.

Among the aforementioned components, the divided-by-N counter 21, the divided-by-M counter 22, the phase frequency detector 23, the charge pump 24, the loop filter 25, and the voltage controlled oscillator 26 are similar to those in the prior art and are not described here.

Figure 9:
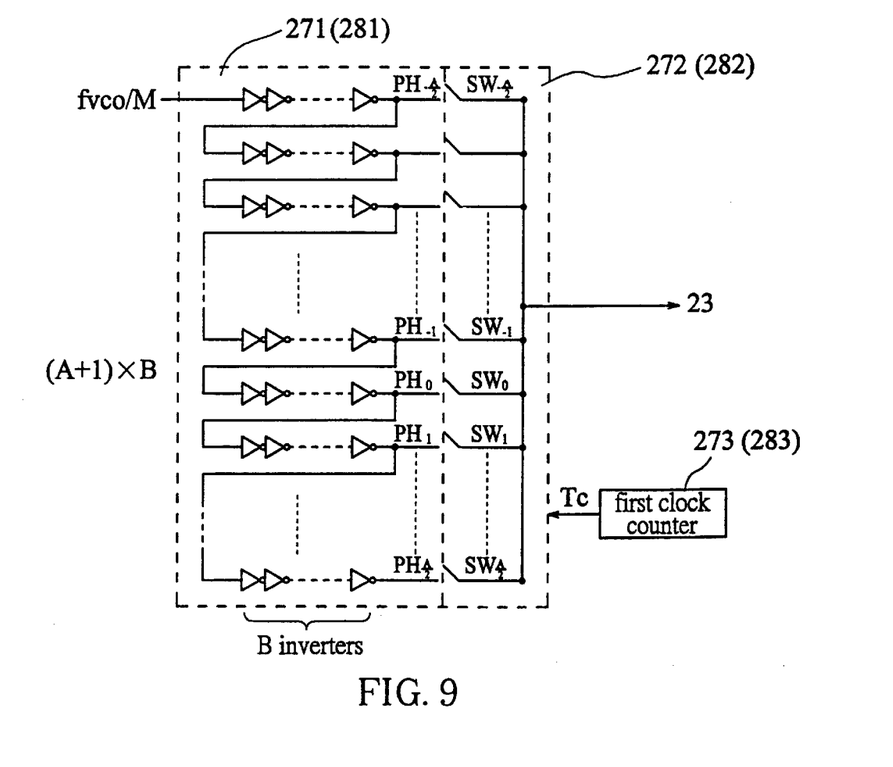
FIG. 9 gives the circuit of an adjustable delay element in accordance with the present invention.
Figure 12:
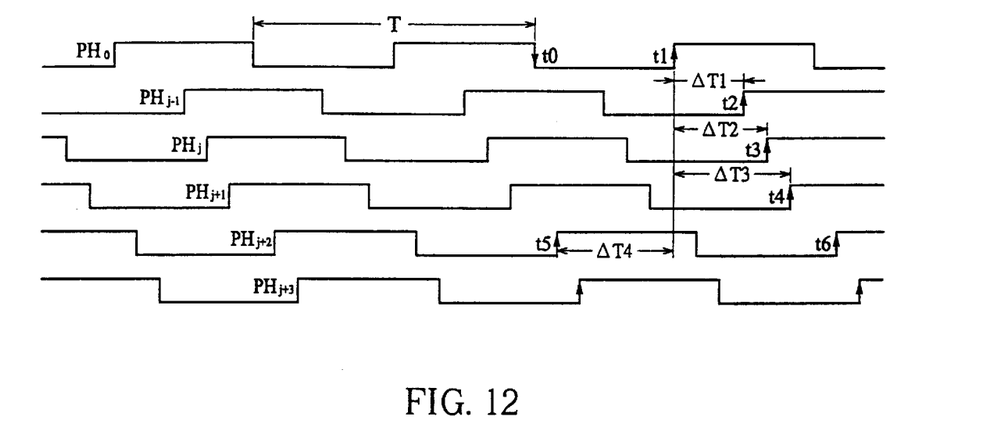
FIG. 12 illustrates the output of the first delay array circuit 271.

The first adjustable delay element 27 comprises a first delay array circuit 271, a first selection switching unit 272, and a first clock counter 273. As shown in FIG. 9, the first delay array circuit 271 is an array circuit comprised of a plurality of inverters in series connection (A+1 rows and B inverters in each row) for receiving the output signals of the divided-by-M counter 22. The first selection switching unit 272 includes a plurality of switches corresponding to the first delay array circuit 271 for selecting the output path of the first delay array circuit 271 so that the signal $f_{vco}/M$ passes a predetermined number of inverters (the output of the inverters is illustrated in FIG. 12) and then enters the phase frequency detector 23. The first clock counter 273 provides a clock signal $T_c$ for controlling the switching time of the first selection switching unit 272.

The way how frequency expansion is achieved by utilizing the first adjustable delay element 27 is described as follows.

It is to be noted that the rising edges of the input signals $f_{xtal}/N$ and $f_{vco}/M$ of the phase frequency detector 23 are used for determining phase lead or phase lag between the two input signals. On the other hand, the switching of the first selection switching unit 272 occurs at a falling edge of its input signal.

Referring to FIG. 12, suppose the phase of $f_{xtal}/N$ is the same as that of $PH_0/M$ originally, then at the time $t_0$, the first clock counter 273 causes the first selection switching unit 272 to switch to $PH_{j-1}$. The first rising edge appears at the time $t_2$, which means $PH_{j-1}$ lags behind $PH_0$ by $(t_2-t_1)$. In this situation, the phase frequency detector 23 outputs an 'up' signal (as illustrated in FIG. 3(a)). Similarly, as shown in FIG. 12, if the selection switching unit switches from $PH_0$ to $PH_j$ or $PH_{j+1}$, a phase lag of $(t_3-t_1)$ or $(t_4-t_1)$ is generated and an 'up' signal is generated.

On the other hand, if the selection switching unit 272 switches from $PH_0$ to $PH_{j+2}$ at the time $t_0$, then the first rising edge of $PH_{j+2}$ appears at the time $t_5$, which means $PH_{j+2}$ leads $PH_0$ by $(t_1-t_5)$. In this situation, the phase frequency detector 23 outputs a 'dn' signal (as illustrated in FIG. 3(b)).

From the above description, it can be understood that the phase frequency detector 23 can be used to generate 'up' and 'dn' signals alternately by incorporating the adjustable delay element 27, which causes $V_c$ to vary linearly and periodically. In other words, the signal $f_{vco}$ can be varied linearly and periodically to achieve the effect of frequency expansion.

Figure 10:
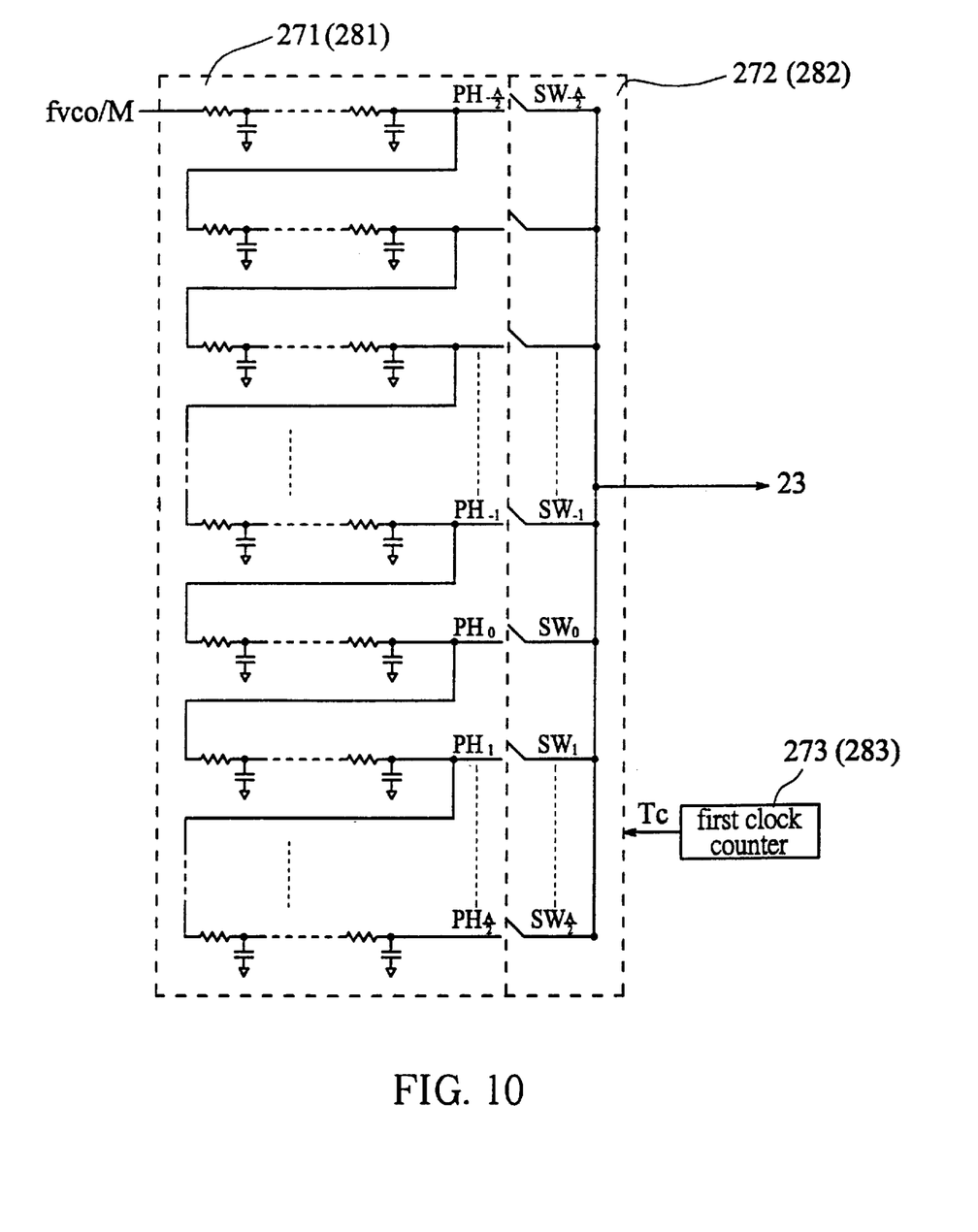
FIG. 10 gives the circuit of another adjustable delay element in accordance with the present invention.
Figure 11:
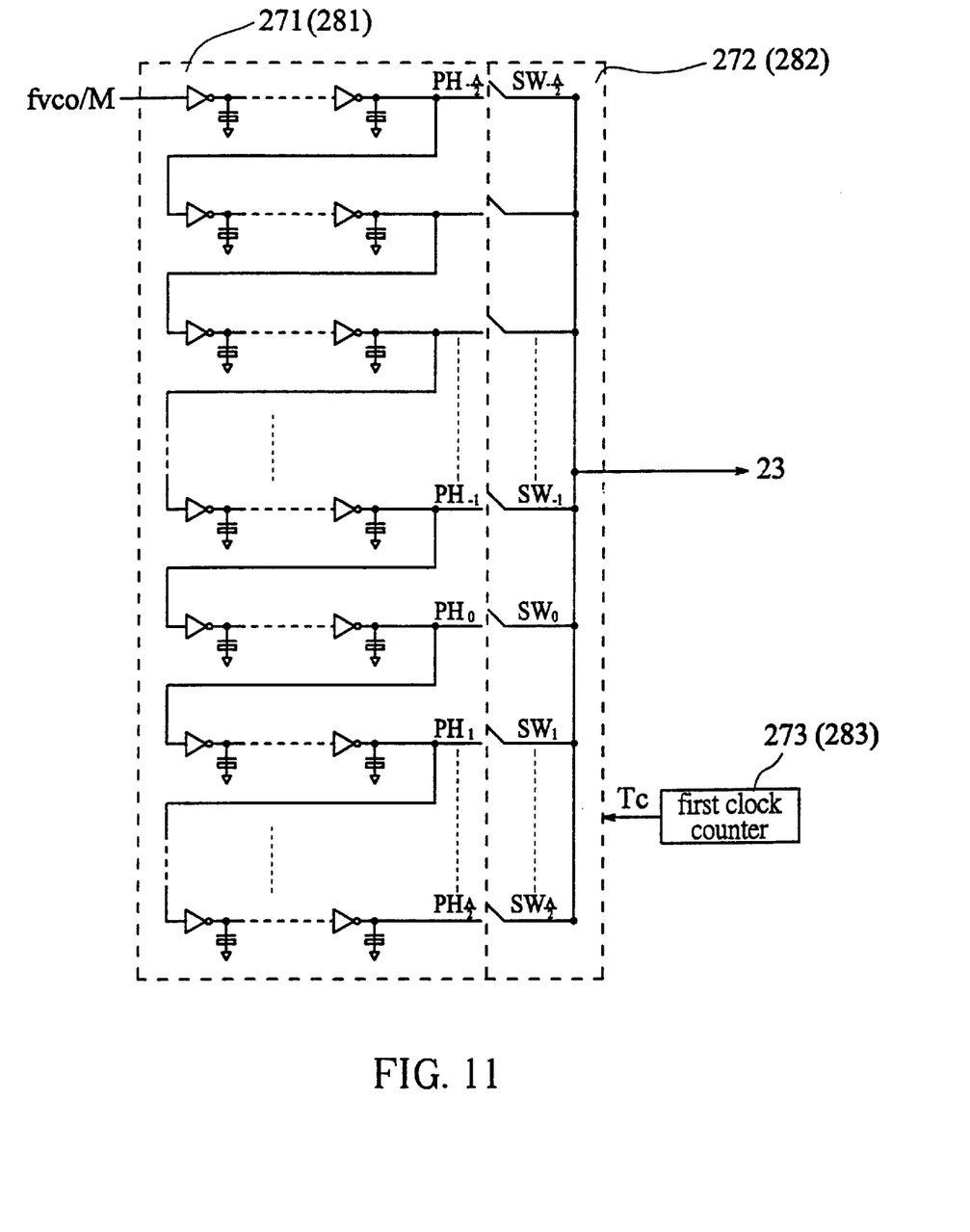
FIG. 11 gives the circuit of yet another adjustable delay element in accordance with the present invention.

It should be noted that in the first embodiment of the present invention, the first delay array circuit 271 consists of a plurality of inverters in series connection. However, it is not limited to this. For example, the first delay array circuit 271 may consist of a plurality of RC delay units in series connection. As shown in FIG. 10, each of the RC delay units consists of a resistor and a capacitor. Furthermore, as shown in FIG. 11, the first delay array circuit 271 may consist of a plurality of delay units, each comprised of an inverter and a MOS element.

The second embodiment of the invention is similar to the first embodiment except the position of the adjustable delay element. The similar components in the first and second embodiments are denoted by the same numerals in the following description.

Figure 13:
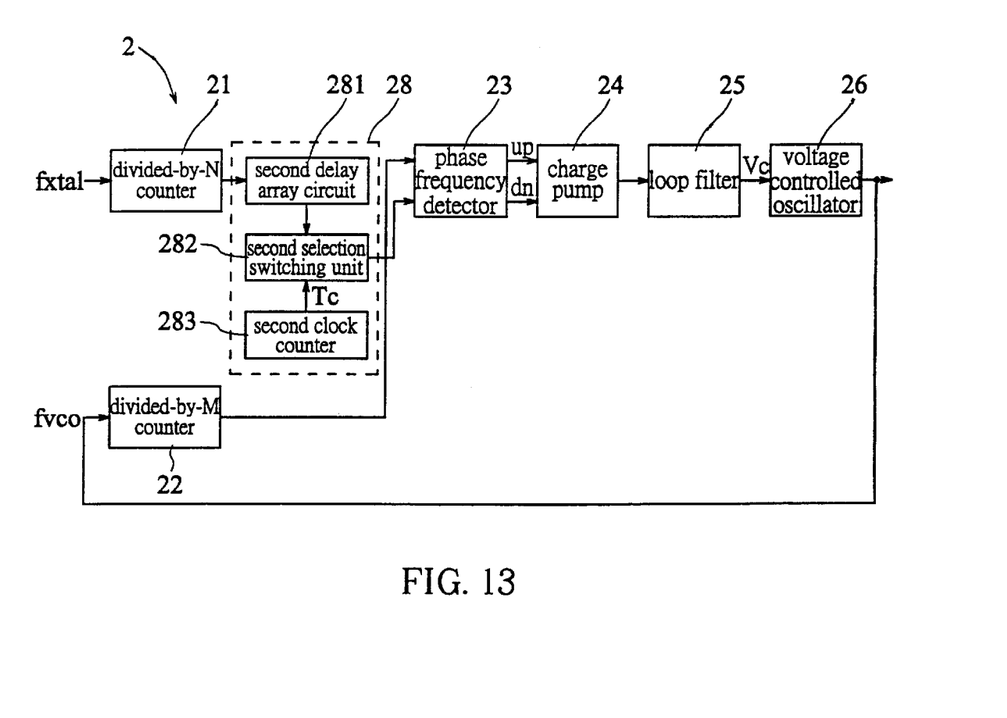
FIG. 13 is the block diagram of the second preferred embodiment of the phase-locked loop in accordance with the present invention.

Referring to FIG. 13, the second embodiment of the phase-locked loop in accordance with the present invention includes a divided-by-N counter 21, a divided-by-M counter 22, a phase frequency detector 23, a charge pump 24, a loop filter 25, a voltage controlled oscillator 26, and a second adjustable delay element 28.

Among these components, the divided-by-N counter 21, the divided-by-M counter 22, the phase frequency detector 23, the charge pump 24, the loop filter 25, and the voltage controlled oscillator 26 are similar to those in the prior art and are not described.

The first adjustable delay element 28 comprises a second delay array circuit 281, a second selection switching unit 282, and a second clock counter 283. As shown in FIG. 9, the second delay array circuit 281 is an array circuit comprised of a plurality of inverters in series connection (A+1 rows and B inverters in each row) for receiving the output signals of the divided-by-N counter 21. The second selection switching unit 282 has a plurality of switches corresponding to the second delay array circuit 281 for selecting the output path of the second delay array circuit 281. Accordingly, the signal $f_{xtal}/N$ passes a predetermined number of inverters (the output signals of the inverters are illustrated in FIG. 12) and then enters the phase frequency detector 23. The second clock counter 283 provides a clock signal $T_c$ for controlling the switching time of the second selection switching unit 282.

The way how frequency expansion is achieved in the second embodiment is similar to that of the first embodiment and is not described here. Briefly speaking, the second adjustable delay element 28 causes the phase frequency detector 23 to output 'up' and 'dn' signals alternately. Thereby, the voltage $V_c$ varies linearly and periodically. In other words, the signal $f_{vco}$ can be varied linearly and periodically to achieve the effect of frequency expansion.

Similarly, the second delay array circuit 281 in the second embodiment of the present invention may consist of a plurality of inverters in series connection, a plurality of RC delay units in series connection, or a plurality of delay units wherein each is comprised of an inverter and a MOS element.

The third embodiment is similar to the first and second embodiments. The only difference lies in that the third embodiment includes two adjustable delay elements. The other components of the third embodiment are substantially the same as those of the first and second embodiments.

Figure 14:
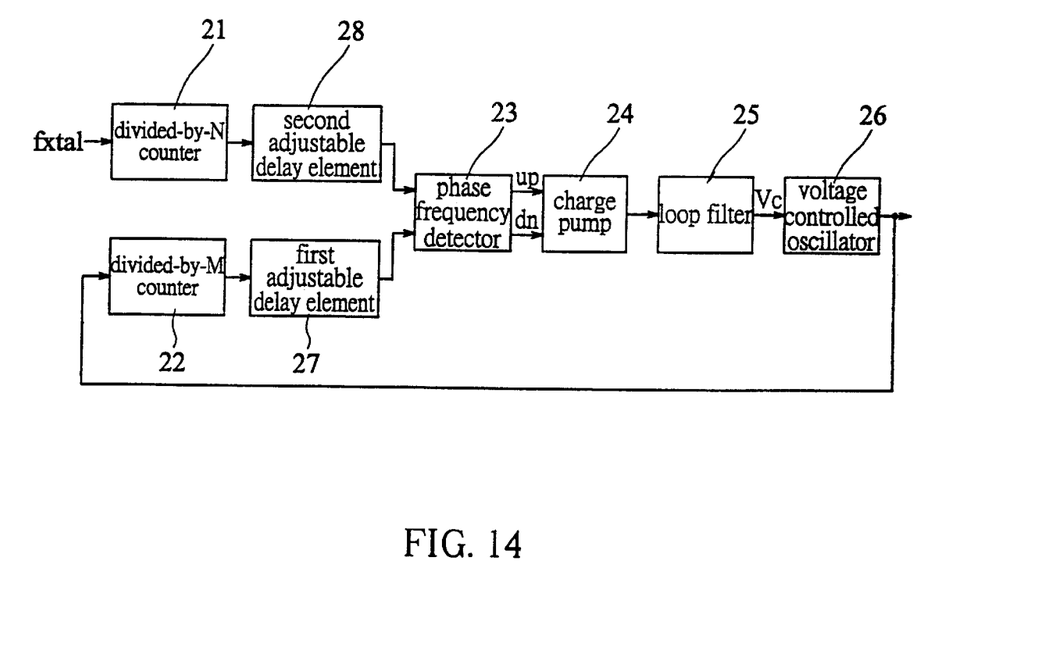
FIG. 14 is the block diagram of the third preferred embodiment of the phase-locked loop in accordance with the present invention.

Referring to FIG. 14, the third embodiment of the phase-locked loop includes a divided-by-N counter 21, a divided-by-M counter 22, a phase frequency detector 23, a charge pump 24, a loop filter 25, a voltage controlled oscillator 26, a first adjustable delay element 27, and a second adjustable delay element 28.

Among these components, the divided-by-N counter 21, the divided-by-M counter 22, the phase frequency detector 23, the charge pump 24, the loop filter 25, and the voltage controlled oscillator 26 are similar to those in the prior art and are not described here.

The circuit and function of the first delay element 27 are the same as those of the first embodiment and the circuit and function of the second delay element 28 are the same as those of the second embodiment.

In the third embodiment, the phase frequency detector 23 receives the output signal of the first adjustable delay element 27 and the output signal of the second adjustable delay element 28 for generating 'up' and 'dn' signals linearly and periodically to achieve the effect of frequency expansion.

Summarizing the above, the phase-locked loop in accordance with the present invention can achieve the effect of frequency expansion by incorporating one or two adjustable delay elements, each of the adjustable delay elements can be constituted by a simple circuit. Therefore, the phase-locked loop in accordance with the present invention can achieve the effect of frequency expansion with reasonable cost.

Although three preferred embodiments of the invention have been illustrated and described, it is obvious to those skilled in the art that various modifications may be made without departing from the scope and spirit of the invention defined by the appended claims.

What is claimed is:

1. A phase-locked loop having an adjustable delay element comprising:

a divided-by-N counter for receiving a first input clock signal and generating a first output clock signal having a frequency 1/N that of said first input clock signal;

a divided-by-M counter for receiving a second input clock signal and generating a second output clock signal having a frequency 1/M that of said second input clock signal;

the adjustable delay element comprising a delay array circuit, a selection switching unit, and a clock counter, wherein said delay array circuit receives the second output clock signal of said divided-by-M counter, said selection switching unit selects an output path of said delay array circuit, and said clock counter provides a clock signal to said selection switching unit for controlling a switching time of said selection switching unit;

a phase frequency detector for generating control signals in response to the phase difference and frequency difference between said output signal of said selection switching unit and said first output clock signal of said divided-by-N counter;

a charge pump for receiving said control signals of said phase frequency detector;

a loop filter coupled to said charge pump for generating a voltage signal in response to the control signals of said phase frequency detector; and a voltage controlled oscillator for generating a clock signal to said divided-by-M counter in response to said voltage signal.

2. A phase-locked loop having an adjustable delay element comprising:

a divided-by-N counter for receiving a first input clock signal and generating a first output clock signal having a frequency 1/N that of said first input clock signal;

a divided-by-M counter for receiving a second input clock signal and generating a second output clock signal having a frequency 1/M that of said second input clock signal;

the adjustable delay element comprising a delay array circuit, a selection switching unit, and a clock counter, wherein said delay array circuit receives the output signal of said divided-by-N counter, said selection switching unit selects an output path of said delay array circuit, and said clock counter provides a clock signal to said selection switching unit for controlling a switching time of said selection switching unit;

a phase frequency detector for generating control signals in response to the phase difference and frequency difference between said output signal of said selection switching unit and said second output clock signal of said divided-by-M counter;

a charge pump for receiving said control signals of said phase frequency detector;

a loop filter coupled to said charge pump for generating a voltage signal in response to the control signals of said phase frequency detector; and a voltage controlled oscillator for generating a clock signal to said divided-by-M counter in response to said voltage signal.

3. A phase-locked loop comprising:

a divided-by-N counter for receiving a first input clock signal and generating a first output clock signal having a frequency 1/N that of said first input clock signal;

a divided-by-M counter for receiving a second input clock signal and generating a second output clock signal having a frequency 1/M that of said second input clock signal;

a first adjustable delay element comprising a first delay array circuit, a first selection switching unit, and a first clock counter, wherein said first delay array circuit receives the second output clock signal of said divided-by-M counter, said first selection switching unit selects an output path of said first delay array circuit, and said first clock counter provides a clock signal to said first selection switching unit for controlling a switching time of said first selection switching unit;

a second adjustable delay element comprising a second delay array circuit, a second selection switching unit, and a second clock counter, wherein said second delay array circuit receives the first output clock signal of said divided-by-N counter, said second selection switching unit selects an output path of said second delay array circuit, and said second clock counter provides a clock signal to said second selection switching unit for controlling a switching time of said second selection switching unit;

a phase frequency detector for generating control signals in response to the phase difference and frequency difference between output signals of said first and second selection switching units, a charge pump for receiving said control signals of said phase frequency detector;

a loop filter coupled to said charge pump for generating a voltage signal in response to the control signals of said phase frequency detector; and a voltage controlled oscillator for generating a clock signal to said divided-by-M counter in response to said voltage signal.

4. A phase-locked loop having an adjustable delay element according to claim 1, wherein said delay array circuit comprises a plurality of inverters in series connection.

5. A phase-locked loop having adjustable delay elements according to claim 3, wherein said first delay array circuit comprises a plurality of inverters in series connection.

6. A phase-locked loop having an adjustable delay element according to claim 1, wherein said delay array circuit comprises a plurality of delay units in series connection.

7. A phase-locked loop according to claim 3, wherein said first delay array circuit comprises a plurality of delay units in series connection.

8. A phase-locked loop having an adjustable delay element according to claim 6, wherein each of said delay units consists of a resistor and a capacitor.

9. A phase-locked loop having adjustable delay elements according to claim 7, wherein each of said delay units consists of a resistor and a capacitor.

10. A phase-locked loop having an adjustable delay element according to claim 6, wherein each of said delay units consists of an inverter and a MOS element.

11. A phase-locked loop having an adjustable delay element according to claim 7, wherein each of said delay units consists of an inverter and a MOS element.

12. A phase-locked loop having an adjustable delay element according to claim 2, wherein said delay array circuit consists of a plurality of inverters in series connection.

13. A phase-locked loop according to claim 3, wherein said delay array circuit consists of a plurality of inverters in series connection.

14. A phase-locked loop having an adjustable delay element according to claim 2, wherein said delay array circuit consists of a plurality of delay units in series connection.

15. A phase-locked loop having adjustable delay elements according to claim 3, wherein said second delay array circuit consists of a plurality of delay units in series connection.

16. A phase-locked loop having an adjustable delay element according to claim 14, wherein each of said delay units consists of a capacitor and a resistor.

17. A phase-locked loop having adjustable delay elements according to claim 15, wherein each of said delay units consists of a capacitor and a resistor.

18. A phase-locked loop having an adjustable delay element according to claim 14, wherein each of said delay units consists of an inverter and a MOS element.

19. A phase-locked loop having adjustable delay elements according to claim 15, wherein each of said delay units consists of an inverter and a MOS element.

\* \* \* \* \*